United States Patent
Li

(10) Patent No.: US 9,705,008 B2
(45) Date of Patent: Jul. 11, 2017

(54) MANUFACTURING METHOD AND STRUCTURE OF OXIDE SEMICONDUCTOR TFT SUBSTRATE

(71) Applicant: Shenzhen China Star Optoelectronics Technology Co., Ltd., Shenzhen, Guangdong (CN)

(72) Inventor: Wenhui Li, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 328 days.

(21) Appl. No.: 14/426,152

(22) PCT Filed: Sep. 19, 2014

(86) PCT No.: PCT/CN2014/086880
§ 371 (c)(1),
(2) Date: Mar. 4, 2015

(87) PCT Pub. No.: WO2016/033836
PCT Pub. Date: Mar. 10, 2016

(65) Prior Publication Data
US 2016/0247940 A1 Aug. 25, 2016

(30) Foreign Application Priority Data
Sep. 2, 2014 (CN) .......................... 2014 1 0445154

(51) Int. Cl.
*H01L 21/00* (2006.01)
*H01L 29/786* (2006.01)
(Continued)

(52) U.S. Cl.
CPC ........ *H01L 29/78696* (2013.01); *H01L 21/77* (2013.01); *H01L 27/12* (2013.01); *H01L 29/41733* (2013.01); *H01L 29/45* (2013.01); *H01L 29/66969* (2013.01); *H01L 29/786* (2013.01); *H01L 29/7869* (2013.01); *H01L 21/32133* (2013.01); *H01L 29/401* (2013.01)

(58) Field of Classification Search
CPC ...................................................... H01L 21/00
See application file for complete search history.

(56) References Cited

FOREIGN PATENT DOCUMENTS

CN 102593053 A 7/2012

*Primary Examiner* — Marvin Payen
(74) *Attorney, Agent, or Firm* — Andrew C. Cheng

(57) ABSTRACT

The present invention provides a manufacturing method and a structure of an oxide semiconductor TFT substrate, in which an oxide conductor layer is used to define a channel of an oxide semiconductor TFT substrate. Since the oxide conductor layer is relatively thin and compared to the known techniques, the width of the channel can be made smaller and the width of the channel can be controlled precisely, the difficult of the manufacturing process of the oxide semiconductor TFT substrate can be reduced and the performance of the oxide semiconductor TFT substrate can be enhanced and the yield rate of manufacture can be increased. In a structure of an oxide semiconductor TFT substrate manufactured with the present invention, since the oxide conductor layer and the oxide semiconductor layer are similar in structural composition, excellent ohmic contact can be formed; the oxide conductor does not cause metal ion contamination in the oxide semiconductor layer; and the oxide conductor layer is transparent so as to help increase aperture ratio.

7 Claims, 4 Drawing Sheets

(51) Int. Cl.
*H01L 21/77* (2017.01)
*H01L 27/12* (2006.01)
*H01L 29/417* (2006.01)
*H01L 29/45* (2006.01)
*H01L 29/66* (2006.01)
H01L 21/3213 (2006.01)
H01L 29/40 (2006.01)

MANUFACTURING METHOD AND STRUCTURE OF OXIDE SEMICONDUCTOR TFT SUBSTRATE

BACKGROUND OF THE INVENTION

1. Field of the Invention

The present invention relates to the field of display technology, and in particular to a manufacturing method of an oxide semiconductor thin-film transistor (TFT) substrate and a structure thereof.

2. The Related Arts

Flat panel display devices have a variety of advantages, such as thin device body, low power consumption, and being free of radiation, and are thus of wide applications. The flat panel display devices that are currently available generally comprise liquid crystal displays (LCDs) and organic light emitting displays (OLEDs).

A comparison between the OLED display technology that is based on organic light emitting diodes and the mature LCD reveals that the OLED is a self-luminous display device having advantages of being self-luminous, high contrast, wide view angle (reaching 170°), fast response, high luminous efficiency, low operation voltage (3-10V), and being ultra-thin (thickness being less than 2 mm) and possessing excellent color display quality, a widened viewing range, and enhanced design flexibility.

Thin-film transistors (TFTs) are a vital constituent component of the flat panel display device and can be formed on a glass substrate or a plastic substrate to serve as a switching device and a driving device in for example LCDs, OLEDs, and electrophoretic displays (EPDs).

Oxide semiconductor TFT technology is one of the hottest contemporary techniques. The oxide semiconductors have a relatively high electron mobility (the electron mobility of the oxide semiconductors being greater than 10 $cm^2$/Vs, while the mobility of a-Si is only 0.5-0.8 $cm^2$/Vs) and, compared to low-temperature poly-silicon (LTPS), the oxide semiconductor has a simple manufacturing process and has relatively high compatibility with a-Si manufacturing processes, making it possible to be applied to LCDs (Liquid Crystal Displays), organic light emitting displays (OLEDs), and flexible displays and also applicable to displays of both large and small sizes and having a prosperous future of development and applications so as to be the hot topic of contemporary researches of the industry.

However, the applications and developments of the oxide semiconductor still face a lot of challenges.

FIG. 1 shows a conventional BCE (Back Channel Etching) TFT, which has a simple structure and less steps of manufacture and is the one that has the highest yield rate and is the most mature in the manufactures of a-Si TFT. Thus, developing BCE oxide semiconductor TFT that has excellent performance is also a hot issue of contemporary researches. A conventional BCE oxide semiconductor TFT comprises a substrate 100, a gate terminal 200, a gate insulation layer 300, and an oxide semiconductor layer 600 located on the gate insulation layer 300. After the formation of the oxide semiconductor layer 600, metal source/drain electrodes 400 are formed. The metal electrodes uses a wet etching process in which a strong acid and the mixture ($HNO_3$/$H_3PO_4$/$CH_3COOH$) thereof is used, which may cause damage to the oxide semiconductor in the back channel, making the manufacture more difficult. The source/drain electrodes 400 are generally of a great thickness and it is hard to control line widths in patternization operations. It is easy to cause deviation of the channel width.

FIG. 2 shows a conventional ESL (Etch Stop Layer) TFT, which comprises a substrate 100, a gate terminal 200, a gate insulation layer 300, IGZO (Indium Gallium Zinc Oxide) formed on the gate insulation layer 300, and metal source/drain electrodes 400. The channel of IGZO 600 comprises thereon a protection layer 700 to protect the IGZO 600 from being damaged. However, an additional process of forming the ESL 700 is needed and the width of the channel is increased, making the size of the TFT expanded and the available design space reduced.

FIG. 3 shows a conventional reversed coplanar TFT, which comprises a substrate 100, a gate terminal 200, a gate insulation layer 300, source/drain electrodes 400 that are formed earlier, and IGZO 600 that is formed later. Due to the thickness of the source/drain electrodes 400, it is easy for the IGZO 600 to become poor on the side slopes of the channel, making the performance affected. Further, metal ions of source/drain electrodes 400 may easily diffuse from the cutting site thereof into the IGZO 600 so as to contaminate the IGZO 600. The source/drain electrodes 400 are generally of a great thickness and it is hard to control line widths in patternization operations. It is easy to cause deviation of the channel width.

SUMMARY OF THE INVENTION

An object of the present invention is to provide a manufacturing method of an oxide semiconductor TFT substrate, which reduces the difficulty of the conventional manufacturing process of oxide semiconductor TFT substrates, improves the performance of the substrate, increases the yield rate of manufacture, and uses an oxide conductor to define a channel of the oxide semiconductor TFT substrate so as to allow a channel width to be made smaller thereby reducing the size of the TFT and making channel width more accurate.

Another object of the present invention is to provide a structure of an oxide semiconductor TFT substrate, which uses an oxide conductor to define a channel of the oxide semiconductor TFT substrate so as to allow a width of the channel o be made smaller, wherein the oxide conductor is similar to the oxide semiconductor in structural composition so that an excellent ohmic contact can be formed; the oxide conductor does not cause metal ion contamination in the oxide semiconductor layer; and the oxide conductor layer is transparent so as to help increase aperture ratio.

To achieve the above objects, the present invention provides a manufacturing method of an oxide semiconductor thin-film transistor (TFT) substrate, which comprises the following steps:

Step 1: providing a substrate and depositing and patternizing an oxide conductor layer on the substrate to form an oxide conductor layer having a channel;

Step 2: depositing and patternizing an oxide semiconductor layer on the oxide conductor layer to form an oxide semiconductor layer;

Step 3: depositing a first insulation layer on the oxide semiconductor layer;

Step 4: depositing and patternizing a first metal layer on the first insulation layer to form a gate terminal;

Step 5: depositing a second insulation layer on the gate terminal;

Step 6: subjecting the first insulation layer and the second insulation layer simultaneously to a patternization operation to form vias; and Step 7: forming a source terminal and a drain terminal on the second insulation layer.

An operation of Step 7 comprises: depositing and patternizing a second metal layer on the second insulation layer, where the second metal layer fills up the vias and is electrically connected to the oxide semiconductor layer to form the drain terminal and the source terminal.

An operation of Step 7 comprises:

Step 71: depositing and patternizing a second metal layer on the second insulation layer, where the second metal layer fills up the via and is electrically connected to the oxide semiconductor layer to form the drain terminal; and Step 72: depositing and patternizing a second oxide conductor layer on the second insulation layer, where the second oxide conductor layer fills up the via and is electrically connected to the oxide semiconductor layer to form the source terminal.

The substrate is a glass substrate and the patternizing operation is achieved with yellow light and etching processes.

The oxide conductor layer is indium tin oxide (ITO) or indium zinc oxide (IZO) and the oxide conductor layer has a thickness less than a thickness of the drain terminal.

The source terminal is ITO or IZO.

The source terminal also functions as a pixel electrode.

The oxide semiconductor layer is an indium gallium zinc oxide (IGZO) oxide semiconductor layer.

The present invention also provides a structure of an oxide semiconductor thin-film transistor (TFT) substrate, which comprises: a substrate, an oxide conductor layer formed on the substrate, an oxide semiconductor layer formed on the oxide conductor, a first insulation layer and a second insulation layer sequentially formed on the substrate and the oxide semiconductor layer, a gate terminal between the first insulation layer and the second insulation layer, a drain terminal formed on the second insulation layer and electrically connected to the oxide semiconductor layer through a via, and a source terminal formed on the second insulation layer and electrically connected to the oxide semiconductor layer through a via.

The oxide conductor layer comprises a channel formed therein and the oxide conductor layer has a thickness less than a thickness of the drain terminal. The drain terminal is metal.

The source terminal is metal or oxide conductor.

The efficacy of the present invention is that the present invention provides a manufacturing method and a structure of an oxide semiconductor TFT substrate, in which an oxide conductor layer is used to define a channel of an oxide semiconductor TFT substrate. Since the oxide conductor layer is relatively thin and compared to the known techniques, the width of the channel can be made smaller and the width of the channel can be controlled precisely, the difficult of the manufacturing process of the oxide semiconductor TFT substrate can be reduced and the performance of the oxide semiconductor TFT substrate can be enhanced and the yield rate of manufacture can be increased. In a structure of an oxide semiconductor TFT substrate manufactured with the present invention, since the oxide conductor layer and the oxide semiconductor layer are similar in structural composition, excellent ohmic contact can be formed; the oxide conductor does not cause metal ion contamination in the oxide semiconductor layer; and the oxide conductor layer is transparent so as to help increase aperture ratio.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
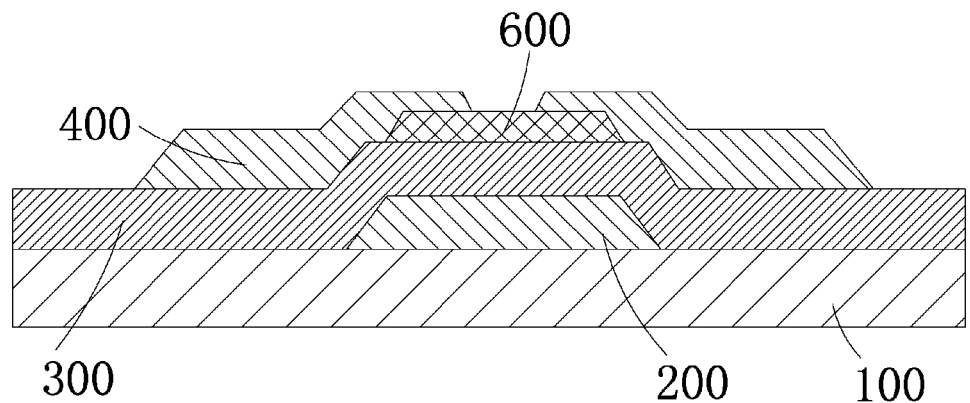
FIG. 1 is a cross-sectional view showing a structure of a conventional oxide semiconductor thin-film transistor (TFT) substrate.
Figure 2:
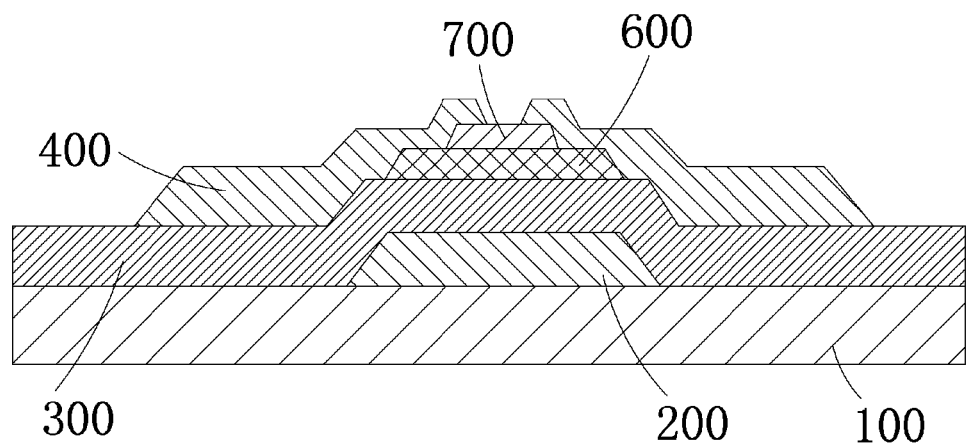
FIG. 2 is a cross-sectional view showing a structure of another conventional oxide semiconductor TFT substrate.
Figure 3:
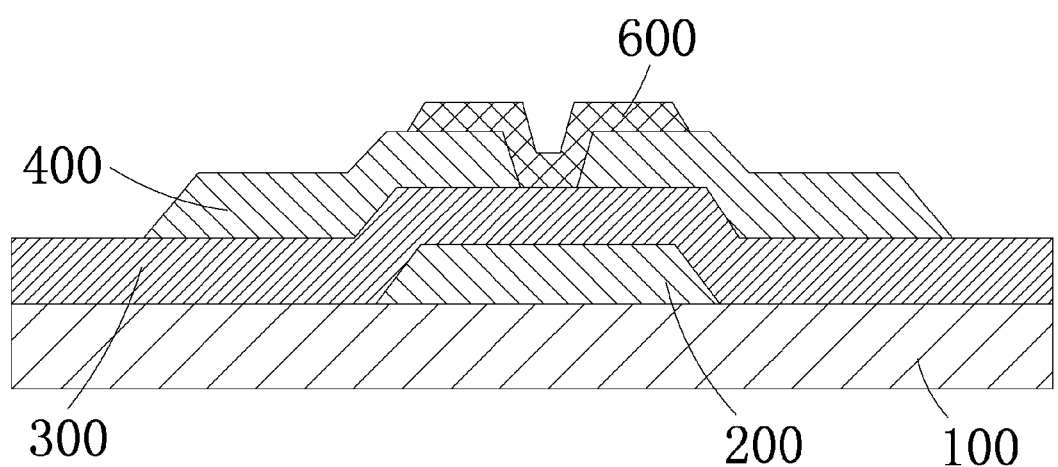
FIG. 3 is a cross-sectional view showing a structure of a further conventional oxide semiconductor TFT substrate.
Figure 4:
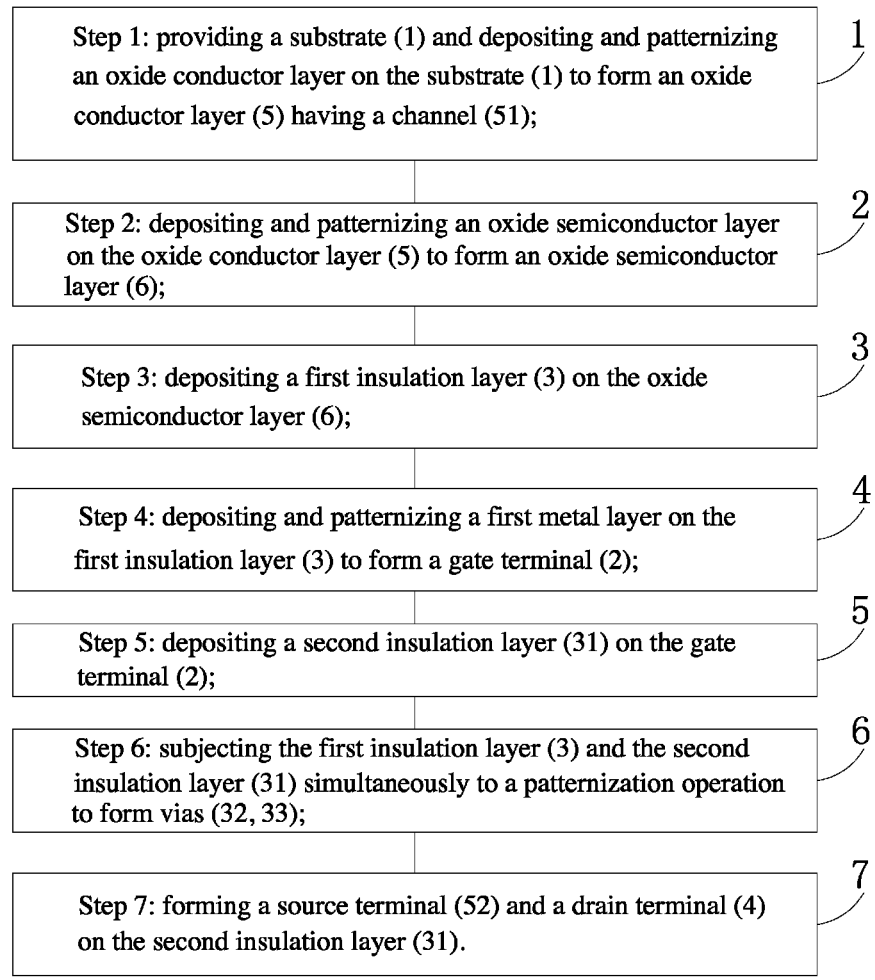
FIG. 4 is a flow chart illustrating a manufacturing method of an oxide semiconductor TFT substrate according to the present invention.
Figure 5:
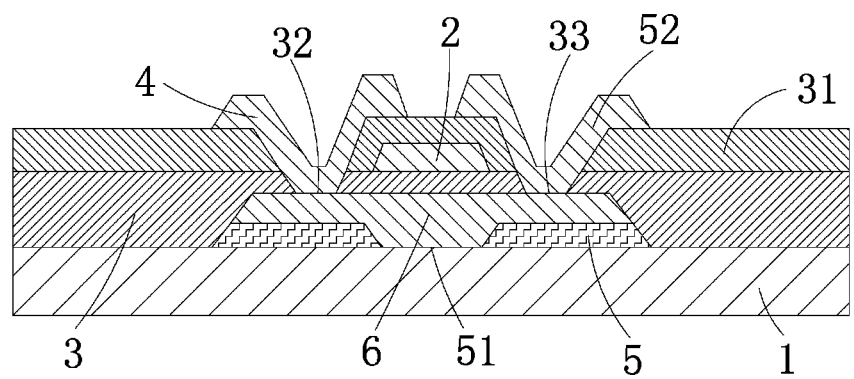
FIG. 5 is a cross-sectional view showing a structure of an oxide semiconductor TFT substrate according to a first embodiment of the present invention.

Referring to FIGS. 4 and 5, a manufacturing method of an oxide semiconductor TFT substrate according to a first embodiment of the present invention comprises the following steps:

Step 1: providing a substrate 1 and depositing and patternizing an oxide conductor layer on the substrate 1 to form an oxide conductor layer 5 having a channel 51.

Preferably, the substrate 1 is a glass substrate.

The oxide conductor layer 5 is ITO (Indium Tin Oxide) or IZO (Indium Zinc Oxide). Preferably, the oxide conductor layer 5 is ITO.

Step 2: depositing and patternizing an oxide semiconductor layer on the oxide conductor layer 5 to form an oxide semiconductor layer 6.

Preferably, the oxide semiconductor layer 6 is IGZO (Indium Gallium Zinc Oxide). The oxide semiconductor layer 6 fills up the channel 51.

Step 3: depositing a first insulation layer 3 on the oxide semiconductor layer 6.

Step 4: depositing and patternizing a first metal layer on the first insulation layer 3 to form a gate terminal 2.

Step 5: depositing a second insulation layer 31 on the gate terminal 2.

The second insulation layer 31 completely covers the first insulation layer 3.

Step 6: subjecting the first insulation layer 3 and the second insulation layer 31 simultaneously to a patternization operation to form vias 32, 33.

Step 7: depositing and patternizing a second metal layer on the second insulation layer 31, where the second metal layer fills up the vias 32, 33 and is electrically connected to the oxide semiconductor layer 6 to form a drain terminal 4 and a source terminal 52.

The oxide conductor layer 5 has a thickness less than a thickness of the drain terminal 4. The patternizing operation is achieved with yellow light and etching processes.

As shown in FIG. 5, based on the manufacturing method of the first embodiment described above, the present invention also provides a structure of an oxide semiconductor TFT substrate, which comprises: a substrate 1, an oxide conductor layer 5 formed on the substrate 1, an oxide semiconductor layer 6 formed on the oxide conductor 5, a first insulation layer 3 and a second insulation layer 31 sequentially formed on the substrate 1 and the oxide semiconductor layer 6, a gate terminal 2 between the first insulation layer 3 and the second insulation layer 31, and a drain terminal 4 and a source terminal 52 formed on the second insulation layer 31 and electrically connected to the oxide semiconductor layer 6 through vias 32, 33.

The oxide conductor layer 5 comprises a channel 51 formed therein and the oxide conductor layer 5 has a thickness less than a thickness of the drain terminal 4. The oxide conductor layer 5 is ITO or IZO. Preferably, the oxide conductor layer 5 is ITO.

The substrate 1 is a glass substrate. The drain terminal 4 and the source terminal 52 are both metal. The oxide semiconductor layer 6 is IGZO.

Figure 6:
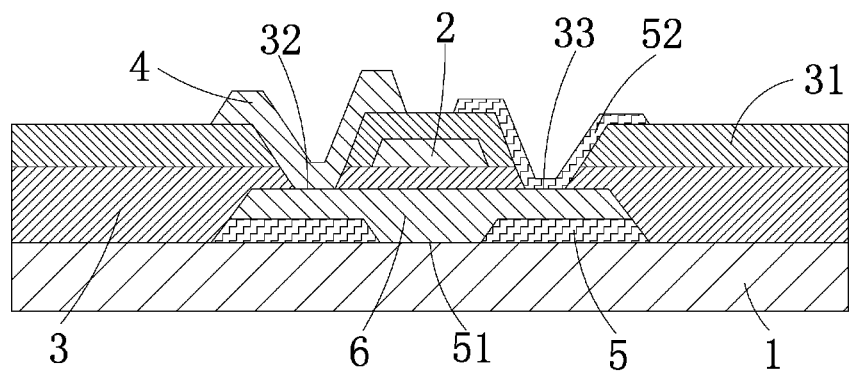
FIG. 6 is a cross-sectional view showing a structure of an oxide semiconductor TFT substrate according to a second embodiment of the present invention.

Referring to FIGS. 4 and 6, a manufacturing method of an oxide semiconductor TFT substrate according to a second embodiment of the present invention comprises the following steps:

Step 1: providing a substrate 1 and depositing and patternizing a first oxide conductor layer on the substrate 1 to form an oxide conductor layer 5 having a channel 51.

Preferably, the substrate 1 is a glass substrate.

The oxide conductor layer 5 is ITO or IZO. Preferably, the oxide conductor layer 5 is ITO.

Step 2: depositing and patternizing an oxide semiconductor layer on the oxide conductor layer 5 to form an oxide semiconductor layer 6.

Preferably, the oxide semiconductor layer 6 is IGZO. The oxide semiconductor layer 6 fills up the channel 51.

Step 3: depositing a first insulation layer 3 on the oxide semiconductor layer 6.

Step 4: depositing and patternizing a first metal layer on the first insulation layer 3 to form a gate terminal 2.

Step 5: depositing a second insulation layer 31 on the gate terminal 2.

The second insulation layer 31 completely covers the first insulation layer 3.

Step 6: subjecting the first insulation layer 3 and the second insulation layer 31 simultaneously to a patternization operation to form vias 32, 33.

Step 7: depositing and patternizing a second metal layer on the second insulation layer 31, where the second metal layer fills up the via 32 and is electrically connected to the oxide semiconductor layer 6 to form a drain terminal 4.

Step 8: depositing and patternizing a second oxide conductor layer on the second insulation layer 31, where the second oxide conductor layer fills up the via 33 and is electrically connected to the oxide semiconductor layer 6 to form a source terminal 52.

The oxide conductor layer 5 has a thickness less than a thickness of the drain terminal 4. The patternizing operation is achieved with yellow light and etching processes.

As shown in FIG. 6, based on the manufacturing method of the second embodiment described above, the present invention also provides a structure of an oxide semiconductor TFT substrate, which comprises: a substrate 1, an oxide conductor layer 5 formed on the substrate 1, an oxide semiconductor layer 6 formed on the oxide conductor 5, a first insulation layer 3 and a second insulation layer 31 sequentially formed on the substrate 1 and the oxide semiconductor layer 6, a gate terminal 2 between the first insulation layer 3 and the second insulation layer 31, a drain terminal 4 formed on the second insulation layer 31 and electrically connected to the oxide semiconductor layer 6 through a via 32, and a source terminal 52 formed on the second insulation layer 31 and electrically connected to the oxide semiconductor layer 6 through a via 33.

The oxide conductor layer 5 comprises a channel 51 formed therein. The oxide conductor layer 5 and the source terminal 52 are both oxide conductor. The oxide conductor is ITO or IZO and preferably, the oxide conductor is ITO. The oxide conductor layer 5 has a thickness less than a thickness of the drain terminal 4.

The substrate 1 is a glass substrate. The drain terminal 4 is metal. The oxide semiconductor layer 6 is IGZO.

It is noted here that the oxide semiconductor layer used in the manufacturing method of an oxide semiconductor TFT substrate according to the present invention can be replaced with other semiconductors, such as a-Si (Amorphous Silicon), poly-Si (Poly-silicon) semiconductor, and organic semiconductors. Further, the structure of the oxide semiconductor TFT substrate according to the present invention is applicable to LCDs, OLEDs, and EPDs and is also applicable to the field of active display devices, such as non-flexible or flexible display devices. Further, display devices of large, medium, and small sizes can all use the structure of the oxide semiconductor TFT substrate according to the present invention.

In summary, the present invention provides a manufacturing method and a structure of an oxide semiconductor TFT substrate, in which an oxide conductor layer is used to define a channel of an oxide semiconductor TFT substrate. Since the oxide conductor layer is relatively thin and compared to the known techniques, the width of the channel can be made smaller and the width of the channel can be controlled precisely, the difficult of the manufacturing process of the oxide semiconductor TFT substrate can be reduced and the performance of the oxide semiconductor TFT substrate can be enhanced and the yield rate of manufacture can be increased. In a structure of an oxide semiconductor TFT substrate manufactured with the present invention, since the oxide conductor layer and the oxide semiconductor layer are similar in structural composition, excellent ohmic contact can be formed; the oxide conductor does not cause metal ion contamination in the oxide semiconductor layer; and the oxide conductor layer is transparent so as to help increase aperture ratio.

Based on the description given above, those having ordinary skills of the art may easily contemplate various changes and modifications of the technical solution and technical ideas of the present invention and all these changes and modifications are considered within the protection scope of right for the present invention.

What is claimed is:
1. A manufacturing method of an oxide semiconductor thin-film transistor (TFT) substrate, comprising the following steps:
   Step 1: providing a substrate and depositing and patternizing an oxide conductor layer on the substrate to form an oxide conductor layer having a channel;

Step 2: depositing and patternizing an oxide semiconductor layer on the oxide conductor layer to form an oxide semiconductor layer;

Step 3: depositing a first insulation layer on the oxide semiconductor layer;

Step 4: depositing and patternizing a first metal layer on the first insulation layer to form a gate terminal;

Step 5: depositing a second insulation layer on the gate terminal;

Step 6: subjecting the first insulation layer and the second insulation layer simultaneously to a patternization operation to form vias; and Step 7: forming a source terminal and a drain terminal on the second insulation layer.

2. The manufacturing method of an oxide semiconductor TFT substrate as claimed in claim 1, wherein an operation of Step 7 comprises: depositing and patternizing a second metal layer on the second insulation layer, where the second metal layer fills up the vias and is electrically connected to the oxide semiconductor layer to form the drain terminal and the source terminal.

3. The manufacturing method of an oxide semiconductor TFT substrate as claimed in claim 1, wherein an operation of Step 7 comprises:

Step 71: depositing and patternizing a second metal layer on the second insulation layer, where the second metal layer fills up the via and is electrically connected to the oxide semiconductor layer to form the drain terminal; and Step 72: depositing and patternizing a second oxide conductor layer on the second insulation layer, where the second oxide conductor layer fills up the via and is electrically connected to the oxide semiconductor layer to form the source terminal.

4. The manufacturing method of an oxide semiconductor TFT substrate as claimed in claim 1, wherein the substrate is a glass substrate and the patternizing operation is achieved with yellow light and etching processes.

5. The manufacturing method of an oxide semiconductor TFT substrate as claimed in claim 1, wherein the oxide conductor layer is indium tin oxide (ITO) or indium zinc oxide (IZO) and the oxide conductor layer has a thickness less than a thickness of the drain terminal.

6. The manufacturing method of an oxide semiconductor TFT substrate as claimed in claim 3, wherein the source terminal is ITO or IZO.

7. The manufacturing method of an oxide semiconductor TFT substrate as claimed in claim 1, wherein the source terminal also functions as a pixel electrode and the oxide semiconductor layer is indium gallium zinc oxide (IGZO).

* * * * *